(12) United States Patent
Oshimo et al.

(10) Patent No.: US 9,136,133 B2
(45) Date of Patent: Sep. 15, 2015

(54) METHOD OF DEPOSITING FILM

(71) Applicant: Tokyo Electron Limited, Tokyo (JP)

(72) Inventors: Kentaro Oshimo, Iwate (JP); Masato Koakutsu, Iwate (JP); Hiroko Sasaki, Iwate (JP); Hiroaki Ikegawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 11 days.

(21) Appl. No.: 14/308,880

(22) Filed: Jun. 19, 2014

(65) Prior Publication Data

US 2015/0011087 A1   Jan. 8, 2015

(30) Foreign Application Priority Data

Jul. 2, 2013   (JP) ................................. 2013-138849

(51) Int. Cl.
| | |
|---|---|
| *H01L 21/00* | (2006.01) |
| *H01L 21/285* | (2006.01) |
| *H01L 21/3205* | (2006.01) |
| *H01L 49/02* | (2006.01) |
| *C23C 16/34* | (2006.01) |
| *C23C 16/455* | (2006.01) |
| *C23C 16/56* | (2006.01) |

(52) U.S. Cl.
CPC .......... *H01L 21/28562* (2013.01); *C23C 16/34* (2013.01); *C23C 16/45551* (2013.01); *C23C 16/56* (2013.01); *H01L 21/32051* (2013.01); *H01L 28/00* (2013.01)

(58) Field of Classification Search
CPC ............ H01L 21/0228; H01L 45/1616; H01L 21/022
USPC ..................................... 438/680, 652
See application file for complete search history.

(56) References Cited

U.S. PATENT DOCUMENTS

2006/0272577 A1* 12/2006 Mao et al. ...................... 118/715
2009/0324828 A1* 12/2009 Kato et al. ................ 427/255.28
2011/0183519 A1* 7/2011 Kaga et al. ..................... 438/680

FOREIGN PATENT DOCUMENTS

| JP | 4583764 | 11/2010 |
| JP | 4661990 | 3/2011 |
| JP | 4811870 | 11/2011 |

\* cited by examiner

*Primary Examiner* — Reema Patel
(74) *Attorney, Agent, or Firm* — IPUSA, PLLC

(57) ABSTRACT

A method of depositing a film is provided. In the method, a first process gas and a second process gas that react with each other is sequentially supplied to cause an atomic layer or a molecular layer of a reaction product of the first process gas and the second process gas to deposit on a substrate in a chamber by repeating a cycle of sequentially supplying the first process gas and the second process gas to the substrate once each cycle. A cycle time of the cycle is set equal to or shorter than 0.5 seconds.

14 Claims, 11 Drawing Sheets

METHOD OF DEPOSITING FILM

CROSS-REFERENCE TO RELATED APPLICATIONS

This patent application is based upon and claims the benefit of priority of Japanese Patent Application No. 2013-138849 filed on Jul. 2, 2013, the entire contents of which are incorporated herein by reference.

BACKGROUND OF THE INVENTION

1. Field of the Invention

The present invention relates to a method of depositing a film.

2. Description of the Related Art

A manufacturing process of a semiconductor integrated circuit (IC) includes a process of forming a thin film on a semiconductor wafer. In this process, improvement in evenness of a surface of a wafer is required in view of further microminiaturization of an IC. As a method of depositing a film to satisfy this requirement, a method of depositing the film called an atomic layer deposition (ALD) method or a molecular layer deposition (MLD) method is considered. According to the ALD method, a cycle in which one (a reaction gas A) of two types of reaction gases, which mutually react, is caused to adsorb on the surface of the wafer, and the adsorbing reaction gas A is reacted with the other one (a reaction gas B) of the two types of reaction gases is repeated thereby depositing a thin film made of a reaction product onto the surface of the wafer. Because the ALD method uses the adsorption of the reaction gas onto the surface of the wafer, the ALD method has an advantage that film thickness evenness and film thickness controllability are excellent.

A turntable-type film deposition apparatus is disclosed in Japanese Patent No. 4661990 as a film deposition apparatus performing the ALD method. This film deposition apparatus includes a turntable, which is rotatable and is positioned in a vacuum chamber, and on which a plurality of wafers are placed, a separation area that is laid out above the turntable and separates a gas supply area for the reaction gas A from a gas supply area for the reaction gas B, evacuation ports corresponding to the gas supply areas where the reaction gas A and the reaction gas B are supplied, and an evacuation device connected to these evacuation ports. In this film deposition apparatus, the wafers pass through the gas supply area for the reaction gas A, the separation area, the gas supply area for the reaction gas B, and the separation area along rotation of the turntable. This causes the reaction gas A to adsorb on the surface of the wafer in the gas supply area for the reaction gas A and the reaction gas A to react with the reaction gas B in the gas supply area for the reaction gas B. Accordingly, it is not necessary to change the reaction gas A to the reaction gas B during the film deposition, and the reaction gases A and B can be continuously supplied. Therefore, there is an advantage that an evacuation/purge process is unnecessary thereby shorting a time period for depositing the film.

Meanwhile, along with higher integration of the semiconductor memory, a capacitor using a high-dielectric material such as a metal oxide as a dielectric layer is more frequently used. The electrodes of this capacitor are made of titanium nitride (TiN) having a relatively great work function. Thus, because titanium nitride is used as the electrodes, the titanium nitride is required to have a low-value resistance, and depositing a low-resistance thin film is required when depositing a thin film of titanium nitride.

The TiN electrodes are produced by depositing a TiN film on a high dielectric layer by a chemical vapor deposition (CVD) method using titanium chloride ($TiCl_4$) and ammonia ($NH_3$) as source gases and patterning the deposited TiN film as disclosed, for example, in Japanese Patent No. 4583764 and Japanese Patent No. 4811870.

Moreover, for example, depositing a film of titanium nitride by the ALD method is thought to be possible by using the above-mentioned turntable type film deposition apparatus, using titanium chloride and ammonia as the source gases, similarly to the CVD method.

However, the above-mentioned film deposition using the CVD method has difficulty depositing a dense film and a TiN film having a sufficiently low-value resistance.

On the other hand, in the above-mentioned ALD method, depositing a dense and low-resistance TiN film is possible because the film deposition of atomic layers or molecular layers in a layer-by-layer manner is possible. Furthermore, in the ALD method, a low-resistance film of another metal nitride is likely to be deposited.

However, in the film deposition of the TiN film, a different process is required from the film deposition of an insulating metal oxide film such as $SiO_2$ that has been performed by using the ALD method. For example, in a film deposition process of TiN, a film deposition temperature and a cycle time for depositing one atomic layer or one molecular layer different from the film deposition of the metal oxide film are required instead of merely supplying different gases.

SUMMARY OF THE INVENTION

Accordingly, embodiments of the present invention may provide a novel and useful method of depositing a film that can deposit a low-resistance thin film by using an ALD method.

According to an embodiment of the present invention, there is provided a method of depositing a film. In the method, a first process gas and a second process gas that react with each other is sequentially supplied to cause an atomic layer or a molecular layer of a reaction product of the first process gas and the second process gas to deposit on a substrate in a chamber by repeating a cycle of sequentially supplying the first process gas and the second process gas to the substrate once each cycle. A cycle time of the cycle is set equal to or shorter than 0.5 seconds.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF EMBODIMENTS

Figure 1:
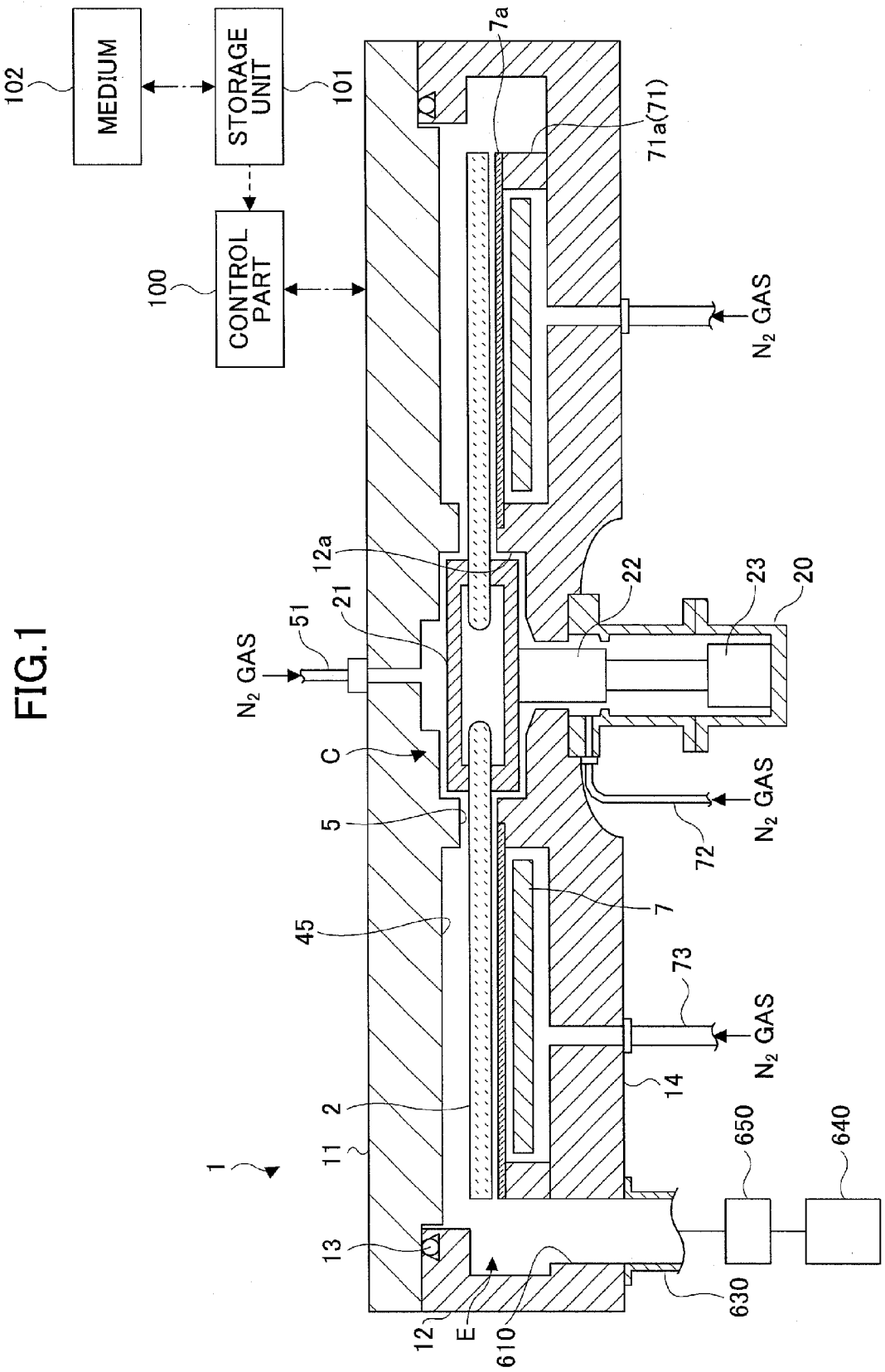
FIG. 1 is a cross-sectional view for illustrating an example of a film deposition apparatus preferable for performing a method of depositing a film of an embodiment of the present invention.

A description is given below, with reference to accompanying drawings of non-limiting, exemplary embodiments of the present invention. In the drawings, the same or corresponding reference marks are given to the same or corresponding members or components. It is noted that the drawings are illustrative of the invention, and there is no intention to indicate scale or relative proportions among the members or components, alone or therebetween. Therefore, the specific thickness or size should be determined by a person having ordinary skill in the art in view of the following non-limiting embodiments.

[Film Deposition Apparatus]

Figure 2:
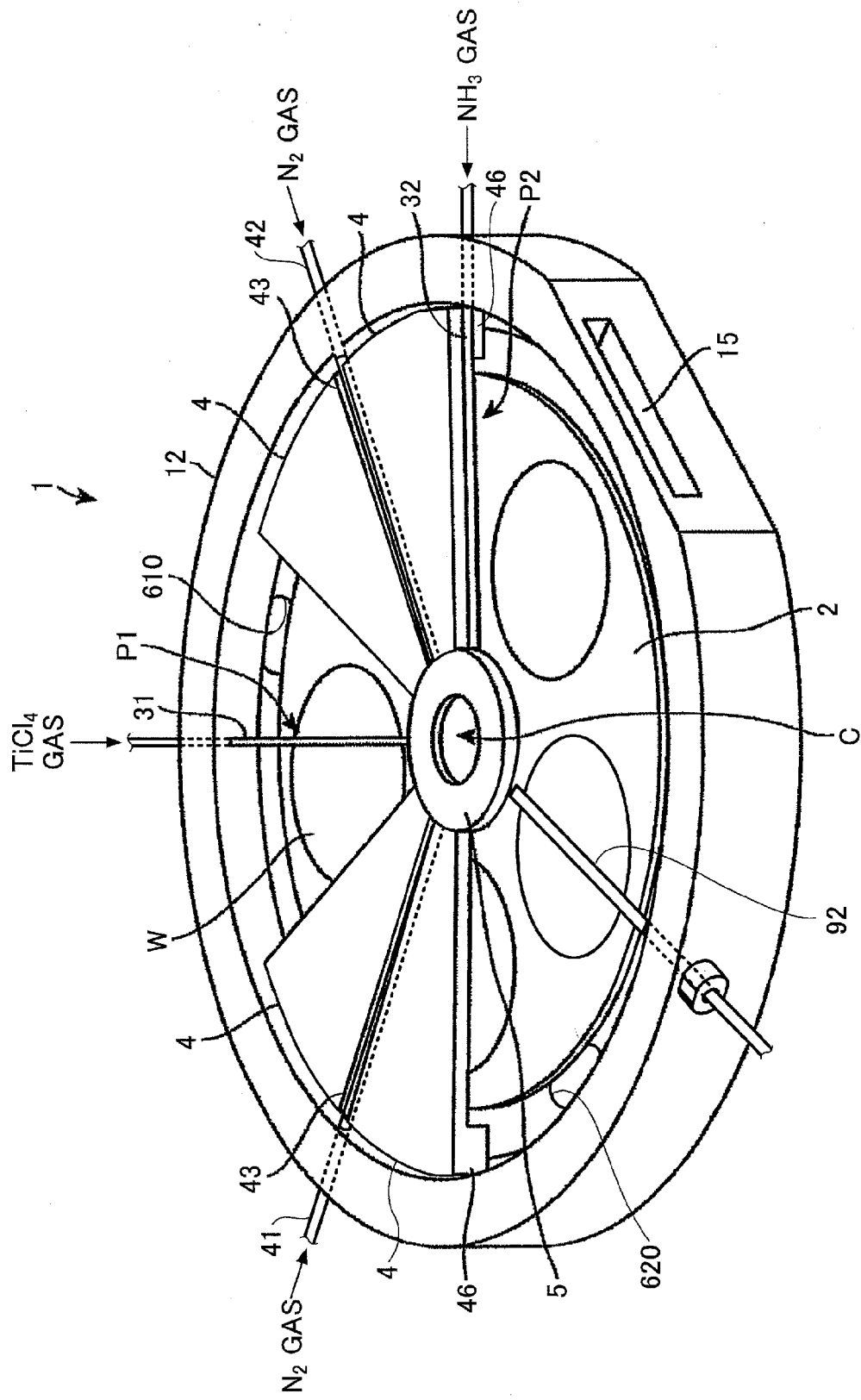
FIG. 2 is a perspective view for illustrating an example of the film deposition apparatus preferable for performing the method of depositing the film of an embodiment of the present invention.
Figure 3:
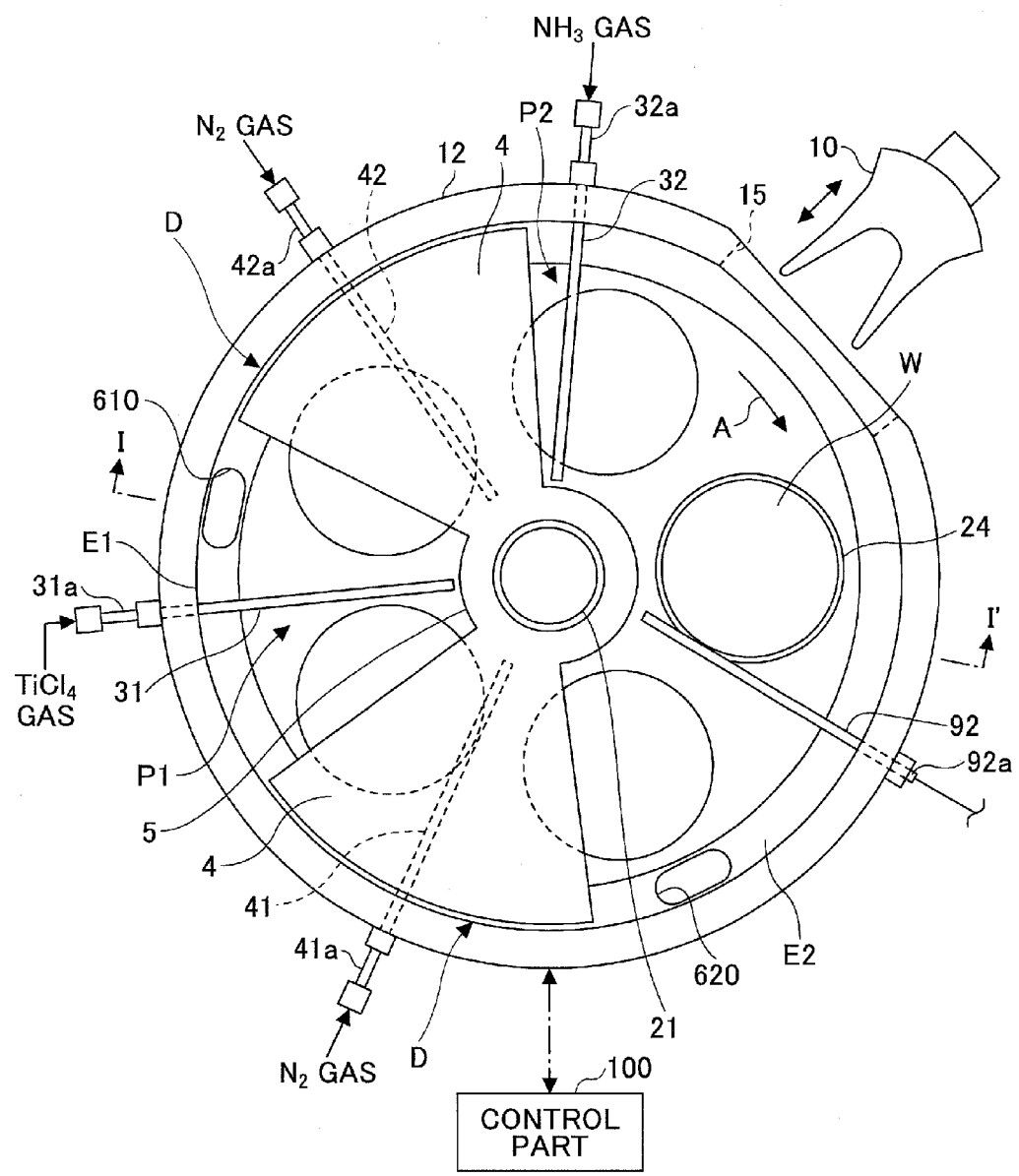
FIG. 3 is a plan view for illustrating an example of the film deposition apparatus preferable for performing the method of depositing the film of an embodiment of the present invention.

FIG. 1 is a cross-sectional view of an exemplary film deposition apparatus preferable for performing a method of depositing a film of an embodiment of the present invention. FIG. 2 is a perspective view of the exemplary film deposition apparatus suitable for performing the method of depositing the film of the embodiment. FIG. 3 is a plan view for illustrating the exemplary film deposition apparatus preferable for performing the method of depositing the film of the embodiment of the present invention.

To begin with, a description is given below of a film deposition apparatus preferable for performing the method of depositing the film of the embodiment. Referring to FIGS. 1 to 3, the film deposition apparatus of the embodiment includes a chamber 1 having a substantially circular shape in its plan view and a flattened shape in its side view, and a turntable 2 having its rotational center in the center of the chamber 1. The chamber 1 includes a chamber body 12 having a bottomed cylindrical shape, and a ceiling plate 11, which is detachably provided on the upper surface of the chamber body 12 through a sealing member 13 (see FIG. 1) such as an O-ring to hermetically seal the chamber 1.

The chamber 1 is a processing chamber to accommodate the turntable 2 and to perform a film deposition process inside thereof. Here, the chamber 1 may be made of a variety of materials, for example, aluminum (Al).

The turntable 2 is fixed by a core portion 21 in a cylindrical shape at the center portion of the turntable 2. The core unit 21 is fixed to the upper end of a rotational shaft 22 extending in the vertical direction. The rotational shaft 22 penetrates through a bottom portion 14 of the chamber 1. The lower end of the rotational shaft 22 is attached to a drive part 23, which causes the rotational shaft 22 (see FIG. 1) to rotate around the vertical axis of the rotational shaft 22. The rotational shaft 22 and the drive part 23 are accommodated in a cylindrical case body 20 whose upper surface is opened. A flange on the upper surface of the case body 20 is hermetically attached to the lower surface of a bottom portion 14 of the chamber 1 to maintain a gastight state between the inner atmosphere and the outer atmosphere of the case body 20.

Referring to FIG. 2 and FIG. 3, circular concave portions 24 for receiving a plurality of semiconductor wafers (five wafers are illustrated in FIGS. 2 and 3) are formed in a surface of the turntable 2 along a rotational direction (a circumferential direction) of the turntable 2. FIG. 3 illustrates a state where the wafer W is placed on only one circular concave portion 24 for convenience. The inner diameter of the circular concave portion 24 is slightly greater than the diameter of the wafer W by, for example, 4 mm. The depth of the circular concave portion 24 is substantially equal to the thickness of the wafer W or slightly deeper than the thickness of the wafer W. Accordingly, when the wafer W is accommodated in the circular concave portion 24, the height of the surface of the wafer W is substantially the same as the height of the surface of the turntable in an area where the wafer is not placed or slightly lower than the height of the surface of the turntable 2. Through-holes (not illustrated), through which lift pins for lifting up and down the back surfaces of the wafers W by supporting the back surfaces, penetrate through the bottom surfaces of the circular concave portions 24. For example, the number of the lift pins is three. The turntable 2 may be made of a variety of materials, for example, quartz.

A rotational speed of the turntable 2 may be set at a proper speed by the drive part 23. In the method of depositing the film of the embodiment, the rotational speed of the turntable 2 is set at a high speed that is equal to or higher than 120 rpm, for example, a speed in a range from 120 to 240 rpm, by which the film deposition process is performed while implementing high productivity. In this regard, a more detailed description is given later.

FIGS. 2 and 3 are diagrams illustrating the structure inside the chamber 1. For convenience, the ceiling plate 11 is omitted from illustration in FIGS. 2 and 3. As illustrated in FIGS. 2 and 3, a reaction gas nozzle 31, a reaction gas nozzle 32, and separation gas nozzles 41, 42, which are made of, for example, quartz, are arranged above the turntable 2 while interposing gaps in a circumferential direction of the chamber 1 (a rotational direction along an arrow A in FIG. 3 of the turntable 2). In FIGS. 2 and 3, the separation gas nozzle 41, the reaction gas nozzle 31, the separation gas nozzle 42, and the reaction gas nozzle 32 are arranged in this order in a clockwise direction (the rotational direction of the turntable 2) from a transfer opening 15 described below. These nozzles 31, 32, 41, and 42 are attached to the chamber body 12 by fixing gas introducing ports 31a, 32a, 41a, and 42a (see FIG. 3), which are base portions of the nozzles 31, 32, 41, and 42, respectively, to the outer peripheral wall of the chamber 1 so as to horizontally extend along a radial direction of the chamber body 12. Thus, these nozzles 31, 32, 41, and 42 are introduced inside the chamber 1 from the outer peripheral wall of the chamber 1.

In the embodiment, the reaction gas nozzle 31 is connected to a supply source (not illustrated) of a titanium chloride (TiCl$_4$) gas through a pipe arrangement, a flow controller, or the like (not illustrated). The reaction gas nozzle 32 is connected to a supply source (not illustrated) of an ammonia gas through a pipe arrangement, a flow controller, or the like (not illustrated). The separation gas nozzles 41 and 42 are connected to a supply source (not illustrated) of a separation gas through a pipe arrangement, a flow controller, or the like (not illustrated). The separation gas may be an inert gas such as a noble gas of helium (He), Argon (Ar) or the like or an inert gas such as a nitrogen (N$_2$) gas or the like. In the embodiment, the N$_2$ gas is used.

A plurality of gas ejection holes 33 opening toward the turntable 2 are arranged in the reaction gas nozzles 31 and 32 along the longitudinal directions of the reaction gas nozzles 31 and 32 at an interval of, for example, 10 mm. In an area below the reaction gas nozzle 31, there is a first process area P1 used to cause a TiCl$_4$ gas to adsorb on the wafer W. The lower area of the reaction gas nozzle 32 is a second process area P2 where the TiCl$_4$ gas adsorbing on the wafer W in the first process area P1 is nitrided.

Referring to FIGS. 2 and 3, two convex portions 4 are provided inside the chamber 1. The convex portions 4 are attached to the back surface of the ceiling plate 11 so as to protrude toward the turntable 2 in order to form the separation areas D with the separation gas nozzles 41, 42. The convex portions 4 are described in detail later. Each convex portion 4 has a substantially sector form in its plan view with its apex cut in a circular arc shape. In this embodiment, an inner circular arc is connected to a ring-shaped protruding portion 5 (described later), and an outer circular arc is arranged along an inner peripheral surface of the chamber body 12 of the chamber 1.

Figure 4:
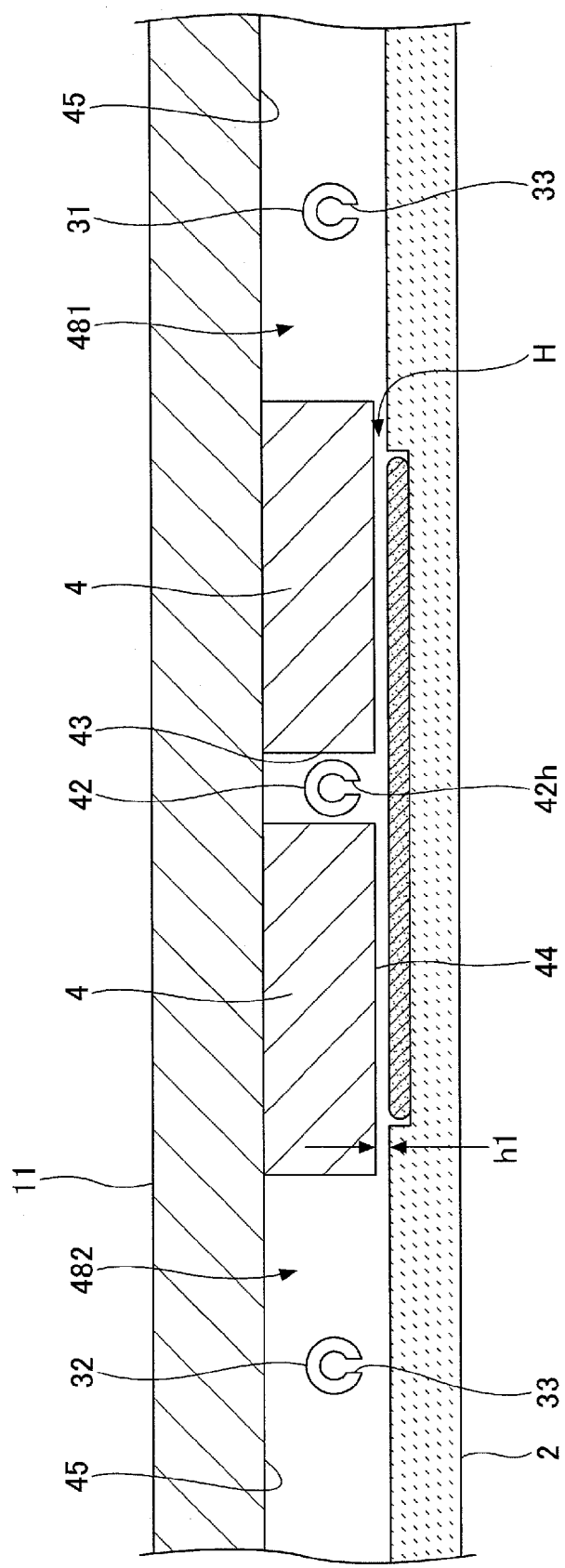
FIG. 4 is a cross-sectional view of a chamber along a concentric circle of a turntable of an example of the film deposition apparatus preferable for performing the method of depositing the film of an embodiment of the present invention.

FIG. 4 illustrates a cross section of the chamber 1 along a concentric circle of the turntable 2 from the reaction gas nozzle 31 to the reaction gas nozzle 32. As illustrated, a convex portion 4 is attached to the back surface of the ceiling plate 11. There are a low ceiling surface 44 (a first ceiling surface), which is a lower surface of the convex portion 4, and a high ceiling surface 45 (a second ceiling surface), which is a higher surface of the convex portion 4 and is positioned on both sides of the low ceiling surface 44 in a circumferential direction. The low ceiling surface 44 is shaped like a sector having its apex cut so as to form like a circular arc in its plan view. Furthermore, as illustrated in FIG. 4, a groove portion 43 is formed in the middle of the convex portion 4 in its circumferential direction so as to extend in a radial direction. The separation gas nozzle 42 is accommodated inside the groove portion 43. Another groove portion 43 is similarly formed in another convex portion 4. The separation gas nozzle 41 is accommodated in the other groove portion 43. The reaction gas nozzles 31 and 32 are provided in spaces under the high ceiling surface 45. The reaction gas nozzles 31 and 32 are provided in the vicinity of the wafer W and apart from the ceiling surface 45. In addition, FIG. 4 illustrates a space 481 under the ceiling surface 45 where the reaction gas nozzle 31 is provided and a space 482 under the ceiling surface 45 where the reaction gas nozzle 32 is provided.

A plurality of gas injection holes 42$h$ (see FIG. 4) opening toward the turntable 2 are provided in the separation gas nozzle 42, which is accommodated in the groove portion 43 of the convex portion 4. The gas injection holes 42$h$ are arranged along the longitudinal direction of the separation gas nozzle 42 at an interval of, for example, 10 mm. Although it is not illustrated, the separation gas nozzle 41 is similar to the gas nozzle 42 in this regard.

A separation space H, which is narrow, is formed between the low ceiling surface 44 and the turntable 2. When the N$_2$ gas is supplied from the gas ejection holes 42$h$ of the separation gas nozzle 42, the N$_2$ gas flows toward the spaces 481 and 482 through the separation space H. At this time, because the volume of the separation space H is smaller than the volumes of the spaces 481 and 482, the pressure of the separation space H can be set relatively higher than the pressures in the spaces 481 and 482 by the N$_2$ gas. In other words, the separation space H having a high pressure is formed between the spaces 481 and 482. Moreover, the N$_2$ gas flowing from the separation space H to the spaces 481 and 482 functions as counter flows against the TiCl$_4$ gas from the first flow area P1 and the NH$_3$ gas from the second process area P2. Accordingly, the TiCl$_4$ gas from the first flow area P1 and the NH$_3$ gas from the second process area P2 are separated by the separation space H. Therefore, it is possible to prevent the TiCl$_4$ gas from the first process area P1 and the NH$_3$ gas from the second process area P2 from mixing and reacting with each other inside the chamber 1.

It is preferable to set the height h1 of the ceiling surface 44 relative to the upper surface of the turntable 2 suitable to make the pressure in the separation space H higher than the pressures in the spaces 481 and 482, considering the pressure inside the chamber 1 during the film deposition, the rotational speed of the turntable 2, the supply amount of the separation gas (the N$_2$ gas), or the like.

As illustrated in FIGS. 2 and 3, a ring-shaped protruding portion 5 surrounding the outer periphery of the core portion 21, to which the turntable 2 is fixed, is provided under the lower surface of the ceiling plate 11. The ring-shaped protruding portion 5 is continuously formed from the convex portions 4 at portions on a side of the rotation center of the convex portions 4. The lower surface of the ring-shaped protruding portion 5 has substantially the same height as that of the ceiling surface 44.

FIG. 1 is a cross-sectional view taken along a line I-I' of FIG. 3. FIG. 1 illustrates an area where the ceiling surface 45 is provided.

Figure 5:
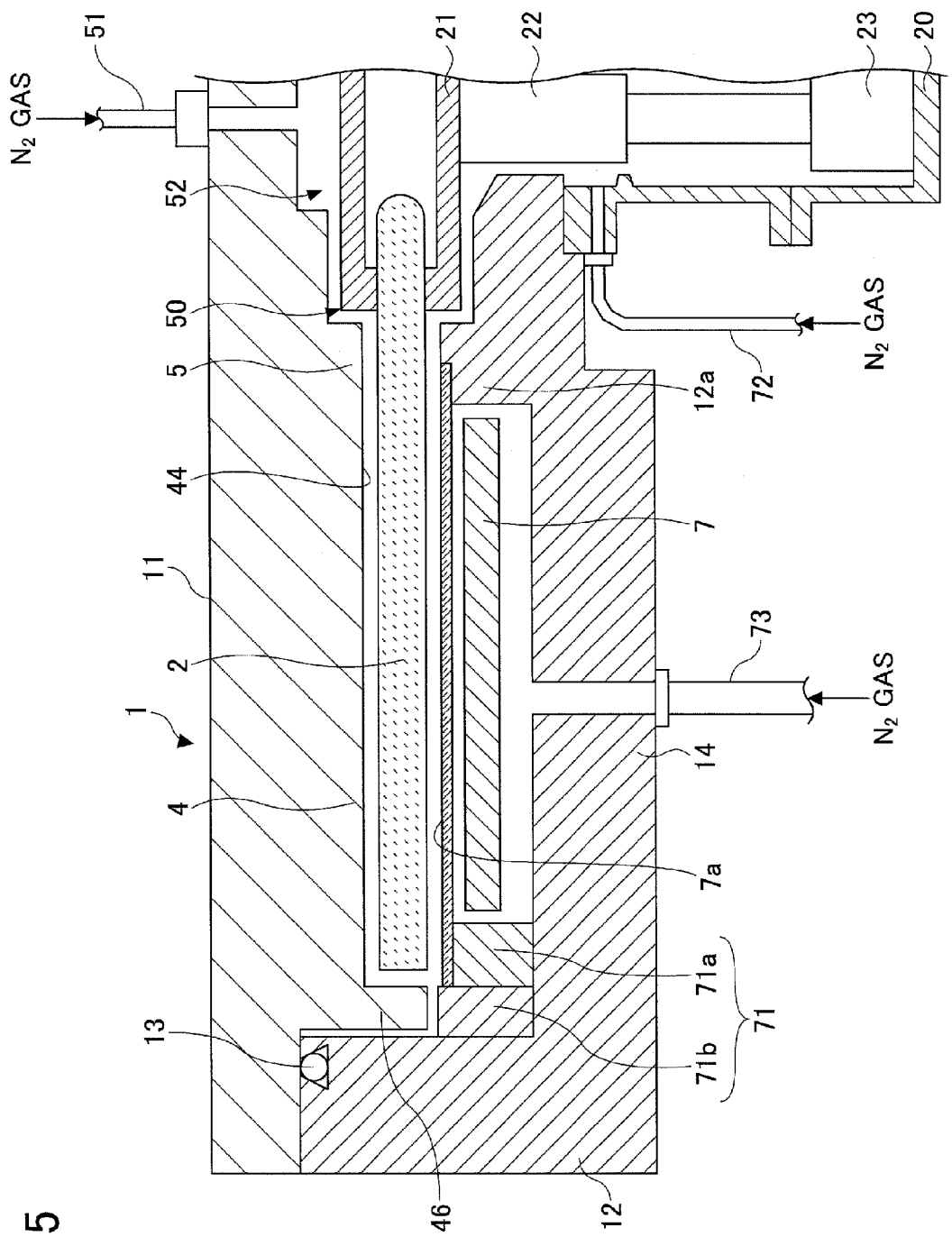
FIG. 5 is a cross-sectional view for illustrating an area provided with a ceiling surface of an example of the film deposition apparatus preferable for performing the method of depositing the film of an embodiment of the present invention.

On the other hand, FIG. 5 is a cross-sectional view of an area including the ceiling surface 44 of the film deposition apparatus 1. As illustrated in FIG. 5, a peripheral edge portion (a portion of the chamber 1 on the outer edge side) of the convex portion 4 shaped into a substantially sector form has a bent portion 46 bent in a L-like shape so as to face the outer end surface of the turntable 2. The bent portion 46 prevents reaction gases from intruding from the both sides of the separation area D to prevent both of the reaction gases from mixing with each other in a manner similar to the convex portion 4. The convex portion 4 shaped into the substantially sector form is provided on the ceiling plate 11. Because the ceiling plate 11 is detachable from the chamber body 12, there is a small gap between the outer peripheral surface of the bent portion 46 and the chamber body 12. A gap between the inner peripheral surface of the bent portion 46 and the outer edge surface of the turntable 2 and a gap between the outer peripheral surface of the bent portion 46 and the chamber body 12 are set to have a dimension similar to, for example, that of a gap between the ceiling surface 44 and the upper surface of the turntable 2.

As illustrated in FIG. 4, the inner peripheral wall of the chamber body 12 is formed to be a vertical surface approaching the outer peripheral surface of the bent portion 46. However, a portion of the inner peripheral wall of the chamber body 12 other than the separation area D is recessed toward the outer side from a part opposite to the outer end surface of the turntable 2 to the bottom portion 14 as illustrated in FIG. 1. Hereinafter, for convenience of explanation, this recessed portion having a substantially rectangular shape in its cross-sectional view is referred to as an evacuation area E. Specifically, as illustrated in FIG. 3, the evacuation area communicating with the first process area P1 is referred to as a first evacuation area E1 and the evacuation area communicating with the second process area P2 is referred to as a second evacuation area E2. A first evacuation port 610 and a second evacuation port 620 are respectively formed in the bottom portions 14 of the first and second evacuation areas E1 and E2, as illustrated in FIGS. 1 through 3. Referring to FIG. 1, the first and second evacuation ports 610 and 620 are connected to, for example, a vacuum pump 640 that is an evacuating unit through exhaust pipes 630. FIG. 1 also illustrates a pressure controller 650.

As illustrated in FIGS. 1 and 4, a heater unit 7 that is a heating means is provided in a space between the turntable 2 and the bottom portion 14 of the chamber 1. The wafer W on the turntable 2 is heated up to a temperature determined in a process recipe (for example, 610° C.) through the turntable 2. The heater unit 7 heats the wafer W placed on the circular concave portion 24 so as to have a predetermined temperature during the film deposition process while the wafer W is placed on the circular concave portion 24.

As illustrated in FIG. 5, on the lower side of the turntable 2, a ring-like cover member 71 is provided to prevent the gas from intruding into a lower area under the turntable 2 by separating an atmosphere across from an upper space above the turntable 2 to the evacuation areas E1 and E2 from an atmosphere where the heater unit 7 is installed. The cover member 71 includes an inner member 71a provided in a position vertically corresponding to the outer edge portion of the turntable 2 and to an outer peripheral side outside the outer edge portion of the turntable 2, and an outer member 71b provided between the inner member 71a and the inner wall surface of the chamber 1. The outer member 71b is provided in the vicinity of the bent portion 46 formed on the outer edge portion of the convex portion 4 in the separation areas D under the bent portions 46. The inner member 71a surrounds the entire periphery of the heater unit 7 and is positioned under the outer edge portion of the turntable 2 and a portion slightly outside the outer edge portion.

A part of the bottom portion 14 closer to the rotation center than the space where the heater unit 7 is arranged has the ring-shaped protruding portion 12a protruding upward so as to approach the core portion 21 provided on the lower surface of the turntable 2 and in the vicinity of the center portion of the turntable 2. A narrow space is provided between the ring-shaped protruding portion 12a and the core portion 21. A gap between the inner peripheral surface of a through-hole for the rotational shaft 22 penetrating through the bottom portion 14 and the rotational shaft 22 is small. The narrow space and the small gap communicate with the inside of the casing 20. A purge gas supply pipe 72 is provided in the case body 20 so that the $N_2$ gas that is the purge gas is supplied into the narrow space to purge the narrow space. In the bottom portion 14 of the chamber 1, a plurality of purge gas supply pipes 73 are provided under the heater unit 7 at intervals of a predetermined angle in the circumferential direction (only one purge gas supply pipe 73 is illustrated in FIG. 5) to purge a space where the heater unit 7 is arranged. Furthermore, a lid member 7a is provided between the heater unit 7 and the turntable 2 to bridge and cover a gap between the inner peripheral wall of the outer member 71b (the upper surface of the inner member 71a) and the upper end portion of the ring-shaped protruding portion 12a along the circumferential direction in order to prevent the gas from intruding into an area in which the heater unit 7 is provided. The lid member 7a can be made of, for example, quartz.

A separation gas supply tube 51 is connected to a center portion of the ceiling plate 11 of the chamber 1. The separation gas of the $N_2$ gas is supplied to a space 52 between the ceiling plate 11 and the core portion 21. The separation gas supplied to the space 52 is discharged toward the periphery of the turntable 2 along the surface on the side of a wafer receiving area of the turntable 2 through a narrow gap 50 between the ring-shaped protruding portion 5 and the turntable 2. The space 50 is maintained to have a pressure higher than those of the spaces 481 and 482 by the separation gas. Therefore, it is possible to prevent the $TiCl_4$ gas supplied to the first process area P1 and the $NH_3$ gas supplied to the second process area P2 from being mixed with each other after passing through the center area C. That is to say, the space 50 (or the center area C) functions in a manner similar to the separation space H (or the separation area D).

As illustrated in FIGS. 2 and 3, a transfer opening 15 is formed in the side wall of the chamber 1 for transferring the wafer W, which is the substrate, between a transfer arm 10 provided outside the chamber 1 and the turntable 2. The transfer opening 15 is opened and closed by a gate valve (not illustrated). The wafer W is transferred between the circular concave portion 24 that is the wafer receiving area of the turntable 2 and the transfer arm 10 at a position facing the transfer opening 15. Furthermore, a lift pin (not illustrated) for lifting the wafer W from the back surface side to serve and receive the wafer W and a lifting mechanism (not illustrated) for lifting the lift pin (not illustrated) are provided at a portion of the turntable 2 corresponding to the position where the wafer W is served and received. The lift pin penetrates through the circular concave portion 24 of the turntable 2.

Moreover, as illustrated in FIG. 1, the film deposition apparatus according to the embodiment includes a control unit 100 constituted of a computer for controlling operations of the entire film deposition apparatus. A program to be executed by the film deposition apparatus under control of the control unit 100 is stored in a memory of the control unit 100. This program includes groups of steps for performing the method of depositing the film as described below and is stored in a medium 102 such as a hard disk, a compact disk, a magnet-optical disk, a memory card, a flexible disk, or the like. The program is read in a memory unit 101 by a predetermined reading device and is installed inside the control unit 100.

[Method of Depositing Film]

Figure 6:
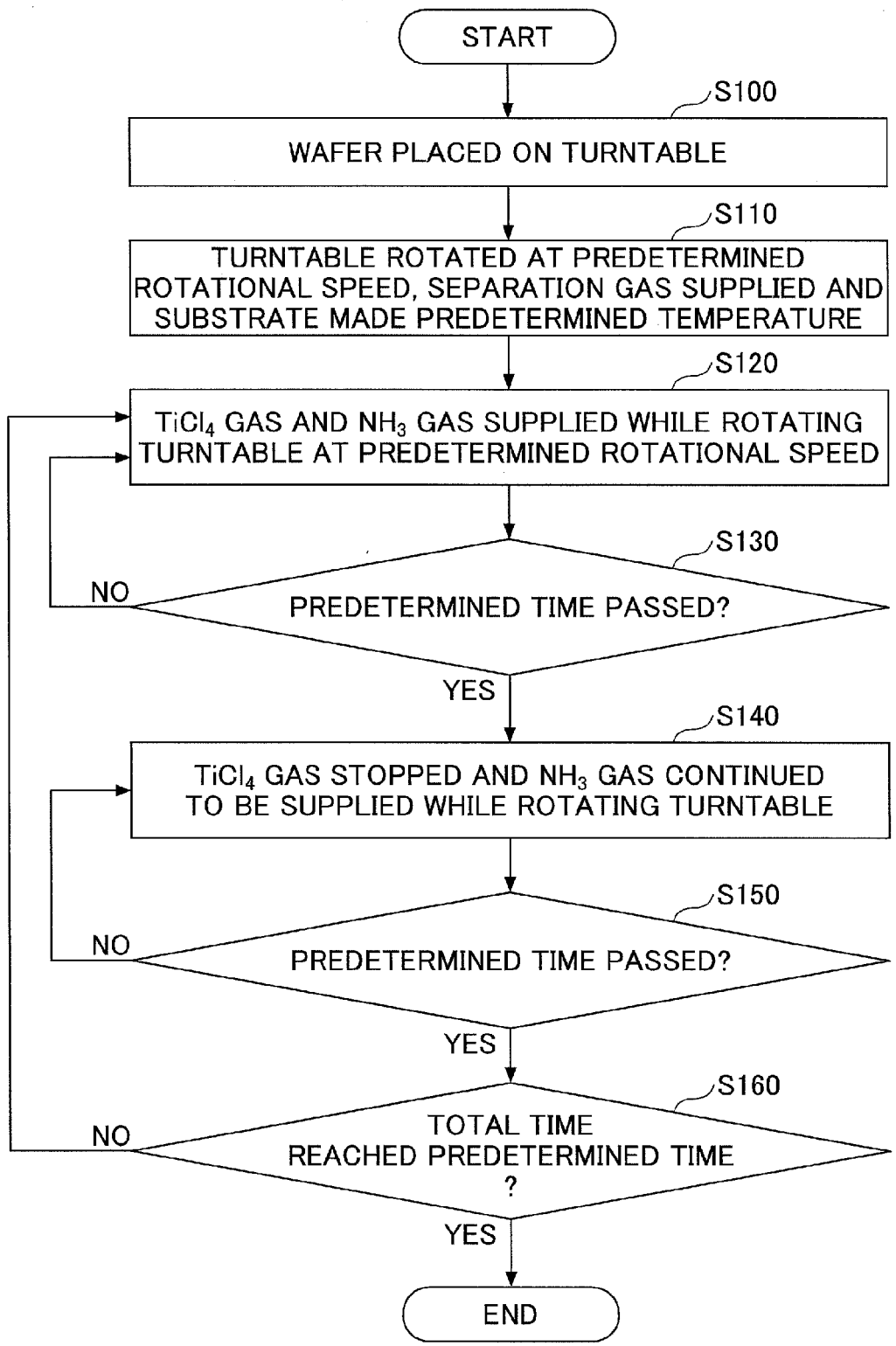
FIG. 6 is a diagram for illustrating a process flow of the method of depositing the film of an embodiment of the present invention.

Referring to FIG. 6, a description is given below of a method of depositing a film according to an embodiment of the present invention. Hereinafter, a description is given by taking an example of using the above film deposition apparatus.

FIG. 6 is a diagram illustrating a process flow of the method of depositing the film of the embodiment of the present invention.

To begin with, in step S100, a wafer W is placed on the turntable 2. More specifically, a gate valve (not illustrated) is opened, and the wafer W is transferred into the circular concave portion 24 of the turntable 2 through the transfer opening (see FIGS. 2 and 3) from the outside by the transfer arm 10 (see FIG. 3). The transfer is performed by causing the not illustrated lift pin to move up and down from the bottom side of the chamber 1 through the through-hole formed in the bottom surface of the circular concave portion 24 when the circular concave portion 24 stops at a position facing the transfer opening 15. Such transfer of the wafer W is performed by intermittently rotating the turntable 2, and the wafers W are placed on five of the circular concave portions 24 of the turntable 2, respectively.

In step S110, the gate valve is closed, and after evacuating the chamber 1 up to a reachable vacuum degree by the vacuum pump 640, an $N_2$ gas is supplied at a predetermined flow rate from the separation gas nozzles 41 and 42. Moreover, an $N_2$ gas is also supplied from the separation gas supply pipe 51 and the purge gas supply pipes 72 at a predetermined flow rate. Following this, the pressure control unit 650 (see FIG. 1) controls the pressure in the chamber 1 so as to be a predetermined process pressure. Next, while rotating the turntable 2 in a clockwise direction at a predetermined rotational speed of 120 rpm or higher, for example, a speed in a range of 120 rpm to 240 rpm, the heater unit 7 heats the wafer W to a predetermined temperature, for example, a temperature in a range of 300 to 610 degrees C.

Here, the rotational speed of the turntable 2 is set at the predetermined speed of 120 rpm or higher, for example, the speed in the range from 120 to 240 rpm, which is much higher than that in a process of depositing an insulating oxide film such as $SiO_2$. For example, when a $SiO_2$ film is deposited by using the above-mentioned film deposition apparatus, the rotational speed of the turntable 2 is frequently set at a low speed that is about 1 to 10 rpm. On the other hand, in the method of depositing the film that deposits a TiN film according to the embodiment of the present invention, the film deposition is performed at a rotational speed that is more than ten times faster than that of the film deposition while depositing the silicon oxide film, for example, at the rotational speed of 120 to 240 rpm. This makes it possible to shorten a time period when $TiCl_4$ adsorbs on the wafer W in the first process area P1 and a time period when the molecular layer of TiN is deposited by causing $TiCl_4$ molecules to react with $NH_3$ molecules on the wafer in the second process area P2, which allows the TiN film to be deposited with a relatively non-dense film density. Then, after depositing the TiN film up to a predetermined film thickness, by continuing to heat the wafer W while further supplying the $NH_3$ gas to the wafer W, and by increasing a grain size of the TiN film by annealing the TiN film while causing the $NH_3$ gas to go into gaps in the TiN film, a low-resistance TiN film can be obtained.

In other words, when the rotational speed of the turntable 2 is low, the reaction of the $TiCl_4$ adsorbing on the wafer W supplied in the first process area P1 with the $NH_3$ supplied in the second process area P2 advances too fast while being subject to the effect of annealing by heating, and the grain size of the TiN film becomes too large. At this time, the TiN film deposition reaction almost finishes, and the $NH_3$ cannot pass through the TiN film even if the $NH_3$ gas is continued to be supplied to improve film property after that. Accordingly, the film improvement effect cannot be sufficiently obtained, and the TiN film is liable not to be able to reduce its resistance sufficiently. In other words, the TiN film containing the $TiCl_4$ molecules remaining therein without sufficiently reacting with the $NH_3$ is deposited on the wafer W, and a high-purity and high-quality TiN film cannot be deposited, which is liable not to be able to obtain the low-resistance film.

Figure 7:
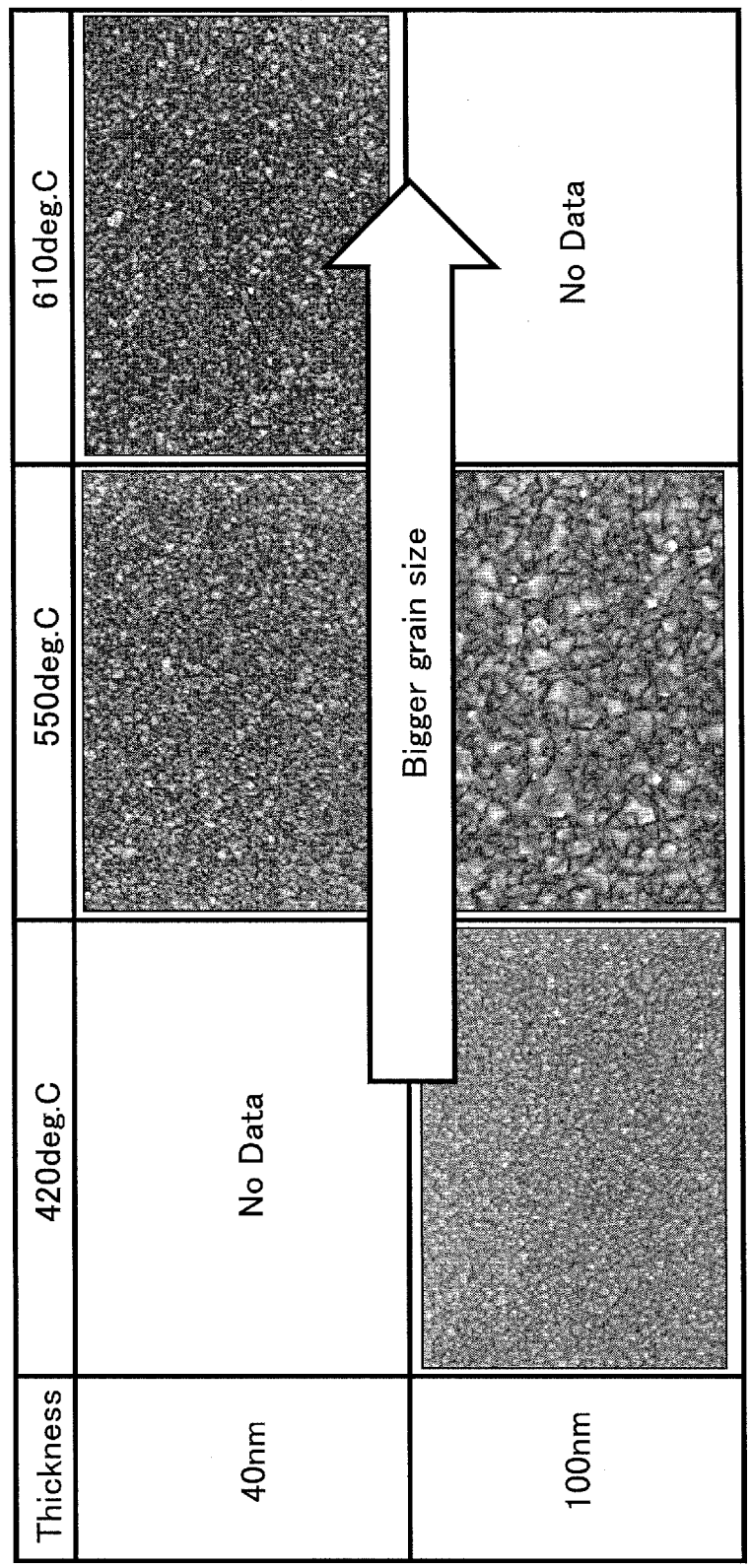
FIG. 7 is a view for illustrating an example of a relationship between a film thickness of a TiN film, a temperature and a grain size.

FIG. 7 is a diagram illustrating an example of a relationship between a film thickness, a temperature and a grain size of a TiN film. In FIG. 7, comparing a picture of 610 degrees C. with one of 550 degrees C. in a film thickness of 40 nm, a grain size at 610 degrees C. is larger than that at 550 degrees C. Comparing the picture of 550 degrees C. with one of 420 degrees C. in a film thickness of 100 nm, the grain size at 500 degrees C. is larger than that at 420 degrees C. Thus, in general, the higher the temperature conditions of a film deposition become, the larger the grain sizes of molecules that make up a film deposited in the film deposition become. Moreover, in general, the resistance value of the film is thought to be smaller as the grain size is larger.

However, when the TiN film is deposited under the same temperature conditions, as discussed above, the quality of the TiN film differs depending on the difference of the rotational speed of the turntable 2 during the film deposition.

Figure 8A:
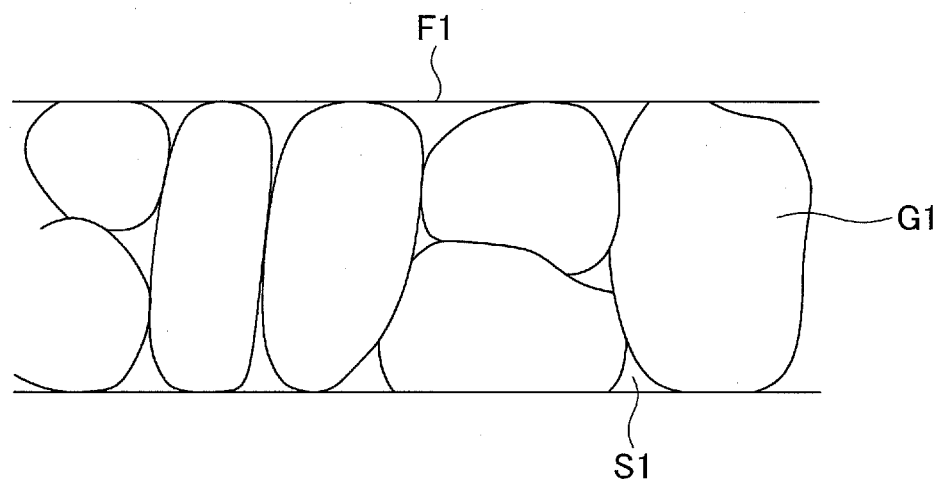
FIGS. 8A and 8B are diagrams for illustrating an example of a relationship between a gap of a film and a grain size.
Figure 8B:
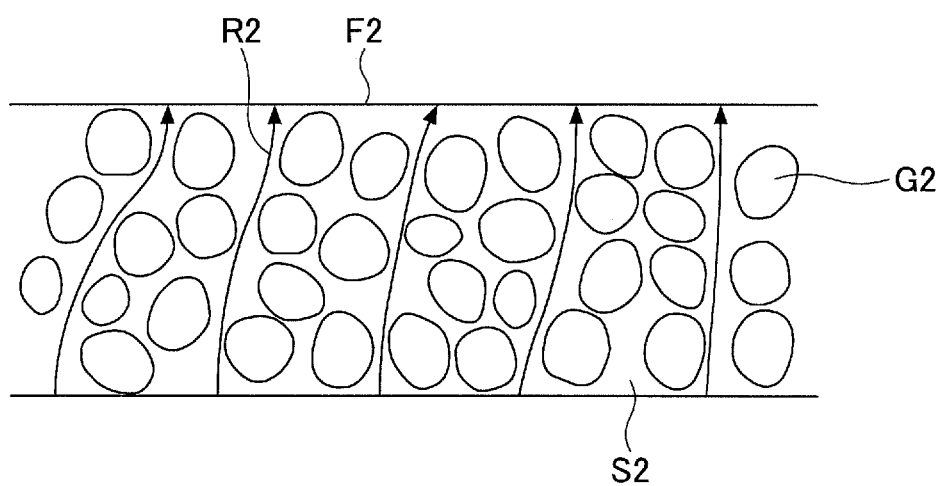

FIGS. 8A and 8B are diagrams illustrating an example of a relationship between a gap and a grain size of a film.

FIG. 8A is a diagram illustrating an example of a cross-section structure of a dense film having a large grain size. FIG. 8A illustrates a relationship between particles G1 constituting a film F1 and gaps S1 in the film F1. As illustrated in FIG. 8A, when the grain sizes of the particles G1 become large from the beginning, the gaps S1 are filled with the particles G1. In this state, for example, even if an $NH_3$ gas is supplied to improve the film property, because the gaps S1 are filled with the particles G1, the $NH_3$ gas cannot intrude into the inside of the film F1. In other words, even though the particles G1 having large grain sizes are obtained, the large gaps S1 and the $TiCl_4$ unreacted with the $NH_3$ remain, and a low-resistance film is liable not to be able to be obtained due to insufficient quality modification of the film F1.

FIG. 8B is a diagram illustrating an example of a cross-section structure of a non-dense film having small grain sizes. FIG. 8B illustrates a relationship between particles G2 that constitute a film F2, gaps S2 and intrusion routes R2. Because the grain sizes of the particles G2 are small and the gaps S2 between the particles G2 become large in the low-density film F2, the intrusion routes R2 to allow the $NH_3$ gas to intrude into the film F2 are ensured. In such a non-dense film F2, by supplying the $NH_3$ gas from the outside and further by heating the film F2 so as to realize the anneal effect, the $NH_3$ gas spreads throughout the film F through the intrusion routes R2, and the effect of quality modification by the $NH_3$ gas can be sufficiently obtained, by which a low-resistance film can be obtained.

By performing the film deposition with the high speed rotation of the turntable 2, the TiN film as illustrated in FIG. 8B can be deposited, and a low-resistance TiN film can be finally obtained.

A description is given of FIG. 6 again. As described by using FIGS. 7, 8A and 8B, as long as the rotation of the turntable 2 is set at a high speed and the time period exposed to the $TiCl_4$ gas can be shortened, even if the heating temperature of the wafer W is high, the deposited TiN film has a small density and becomes a non-dense film having gaps through which the $NH_3$ can pass. Then, after depositing the TiN film up to a predetermined film thickness, by stopping the supply of the $TiCl_4$ gas and by performing a post-ammonia process that continues to supply only the $NH_3$ gas, the $NH_3$ goes into the TiN film sufficiently, and because the grain sizes grow by the anneal effect, the low-resistance TiN film can be deposited.

Here, the rotational speed of the turntable 2 corresponds to a cycle time of one cycle to cause the wafer W to receive the supply of all necessary reaction gases to deposit one molecular layer on the wafer W. In other words, by a single rotation of the turntable 2, the wafer W passes the first process area P1, the separation area D, the second process area P2 and the separation area D once, respectively, and finishes the molecular layer formation of one cycle. Hence, the rotational speed of the turntable 2 relates to one cycle for depositing a minimum unit of the molecular layer on the wafer W, and is converted to the cycle time. More specifically, when rotating the turntable 2 at 120 rpm, which means the turntable 2 rotates 120 times for one minute, that is to say, 60 (seconds)/120 (rotations)=0.5 seconds/rotation, the cycle time for one cycle becomes 0.5 seconds. Similarly, when rotating the turntable 2 at 240 rpm, which means 60 (seconds)/240 (rotations)=0.25 seconds/rotation, the cycle time for one cycle becomes 0.25 seconds.

By using the cycle time, the method of depositing the film of the embodiment can be applied to an ALD apparatus that performs the ALD reaction without using the turntable 2. For example, when process management is performed by a supply time of gases from the reaction nozzles 31 and 32 in the chamber 1, by setting the cycle time at a short time from 0.25 to 0.5 seconds, the method of depositing the film of the embodiment can be performed. However, hereinafter, a description is mainly given with respect to the method of performing the ALD film deposition by rotating the turntable 2 receiving the wafer W thereon.

In this manner, by rotating the turntable 2 at a high speed, depositing the non-dense TiN film by performing the ALD reaction in a short cycle time at first, delivering the $NH_3$ throughout the TiN film, and further causing the anneal effect to act on the TiN film as necessary, a low-resistance TiN film can be deposited.

Moreover, in the present step, the temperature of the wafer W is set. The temperature of the wafer W may be set at a proper temperature suitable for each film deposition process, for example, at a predetermined temperature in a range from 300 to 610 degrees C. Because the anneal effect frequently occurs from about 300 degrees C., the temperature range of the method of depositing the film of the embodiment has the anneal effect of increasing the grain size at any temperature. The preset temperature of the wafer W may be set at the proper temperature suitable for the process as described above, and for example, the temperature may be set at a relatively high temperature in a range from 450 to 610 degrees C., or at a predetermined further higher temperature in a range from 550 to 610 degrees C. In the film deposition process of the TiN film, the temperature of the wafer W is frequently set at a relatively high temperature, for example, at a temperature such as 550 degrees C., 580 degrees C., 600 degrees C., 610 degrees C. or the like. The method of depositing the film of the embodiment can be preferably applied to such a high temperature process. Here, 610 degrees C. is just set as preset temperature limitations of existing film deposition apparatuses, and for example, if a film deposition apparatus that can set a higher temperature is developed, the method of depositing the film can be applied to a temperature range such as 620 to 650 degrees C. or the like that is higher than 610 degrees C.

In any case, in the method of depositing the film of the embodiment, as long as the cycle time is set at 0.5 seconds or shorter, the film deposition can be performed in a variety of temperature ranges. Here, because the cycle time cannot be zero seconds, even when the cycle time is 0.5 seconds or shorter, the cycle time is longer than zero and equal to or shorter than 0.5 seconds.

In step S120, a film deposition process is performed. In the film deposition process, a $TiCl_4$ gas is supplied from the reaction gas nozzle 31 and an $NH_3$ gas is supplied from the reaction gas nozzle 32 (see FIGS. 2 and 3). The wafer W passes through the first process area P1, the separation area D (separation space H), the second process area P2, and the separation area D (separation space H) in this order by the rotation of the turntable 2 (see FIG. 3). First, the $TiCl_4$ gas from the reaction gas nozzle 31 adsorbs on the wafer W in the first process area P1. Next, when the wafer W reaches the second process area P2 after passing through the separation space H (separation area D) in an $N_2$ gas atmosphere, the $TiCl_4$ gas adsorbing on the wafer W reacts with the $NH_3$ gas from the reaction gas nozzle 32, and a TiN film is deposited on the wafer W. Furthermore, $NH_4Cl$ is generated as a by-product, released into a gas phase, and exhausted with the separation gas and the like. After that, the wafer W reaches the separation area D (the separation space H in the $N_2$ gas atmosphere).

As described in detail in step S110, the rotational speed of the turntable 2 is set at 120 rpm or higher, for example, at a predetermined high-speed rotational speed in the rage from 120 to 240 rpm, and the cycle time is set at 0.5 seconds or shorter, for example, at a predetermined time in the range from 0.25 to 0.5 seconds. By performing the film deposition process in a short cycle time, a non-dense TiN film leaving the intrusion routes R2 into which the $NH_3$ can intrude can be deposited.

In addition, the temperature of the wafer W may be set at a predetermined temperature suitable for the process. When the temperature is set constant during the film deposition process including a film property modification treatment thereafter, for example, the temperature may be set at a predetermined high temperature in a range from 550 to 610 degrees C. that realizes the anneal effect of increasing the grain size.

By performing such setting, the low-density TiN film having the moderate grain sizes that are not too large can be deposited. Moreover, by rotating the turntable 2 at a high speed, the productivity of the film deposition can be improved.

In step S130, it is determined whether the supply of the $TiCl_4$ gas from the reaction gas nozzle 31 and of the $NH_3$ gas from the reaction gas nozzle 32 has been performed for a predetermined time period. The predetermined time period can be set at an appropriate time period in each process.

In step S130, when the predetermined time period has not passed yet, the process returns to step S120 and the film deposition of the TiN film is continued. When the predetermined time period has already passed, the process advances to the next step S140.

In step S140, a film property improvement process is performed. In the film property improvement process, the rotation of the turntable 2 and the supply of the $NH_3$ gas from the reaction gas nozzle 32 are continued, but the supply of the $TiCl_4$ gas from the reaction gas nozzle 32 is stopped. This causes the wafer W to be exposed to the $N_2$ gas (separation gas) and the $NH_3$ gas sequentially. In the deposited TiN film, unreacted $TiCl_4$ or a chlorine (Cl) generated by decomposition of the $TiCl_4$ is likely to remain. By stopping the supply of the $TiCl_4$ gas and by continuing the supply of the $NH_3$ gas that reacts with the $TiCl_4$ to make up for $NH_3$, the unreacted $TiCl_4$ reacts with the $NH_3$ gas to generate the TiN, and the remaining Cl becomes the $NH_4Cl$ by reacting with the $NH_3$ gas and is released from the film. Because of this, impurities in the deposited TiN film are reduced, and the film property improves, which enables the resistivity thereof to decrease. As discussed above, because the TiN film ensures the gaps S2 and routes R2 into which the $NH_3$ gas intrude, the $NH_3$ modification treatment can improve the film property and lower the resistance sufficiently.

In the film property improvement process, to distribute the $NH_3$ gas throughout the TiN film sufficiently, the rotational speed of the turntable 2 may be switched to a low speed rotation without setting the high speed rotation such as being set during the film deposition. For example, in the film property improvement process, the rotational speed of the turntable 2 may be set at 10 to 30 rpm. Supplying the $NH_3$ gas at the low speed rotation can realize the anneal effect sufficiently while sufficiently supplying the $NH_3$ gas into the TiN film.

Moreover, in the film property improvement process, the pressure in the chamber 1 may differ from that during the film deposition. In this manner, in the film property improvement process, a proper flow may be performed by using a process recipe different from that in the film deposition.

In step S150, it is determined whether the supply of the $NH_3$ gas from the reaction nozzle 31 has been carried out for a predetermined time period. The predetermined time period may be properly set considering the film thickness of the TiN film to be deposited in a film deposition processing step. For example, the predetermined time period may be set at 150 to 600 seconds to make the film thickness 5 to 40 nm, or the predetermined time period may be set at 300 to 600 seconds to make the film thickness 10 to 40 nm.

Here, the time period of the film property improvement process may be set longer than that of the film deposition process to realize the effect of the film property improvement sufficiently.

In step S150, when the predetermined time period has not passed, step S140 is continued. When the predetermined time period has passed, the process goes to the next step S160.

In step S160, it is determined whether a total time period of the time period in step S130 and the time period in step S150 reaches a predetermined time period. When the total time period does not reach the predetermined time period, the process returns to step S120, and the TiN film is further deposited. When the total time period reaches the predetermined time period, the supply of the $TiCl_4$ gas and the $NH_3$ gas is stopped, and the film deposition is finished.

As described above, by implementing the method of depositing the film of the embodiment illustrated in FIG. 6, a low-resistance film can be deposited.

Working Example

Figure 9:
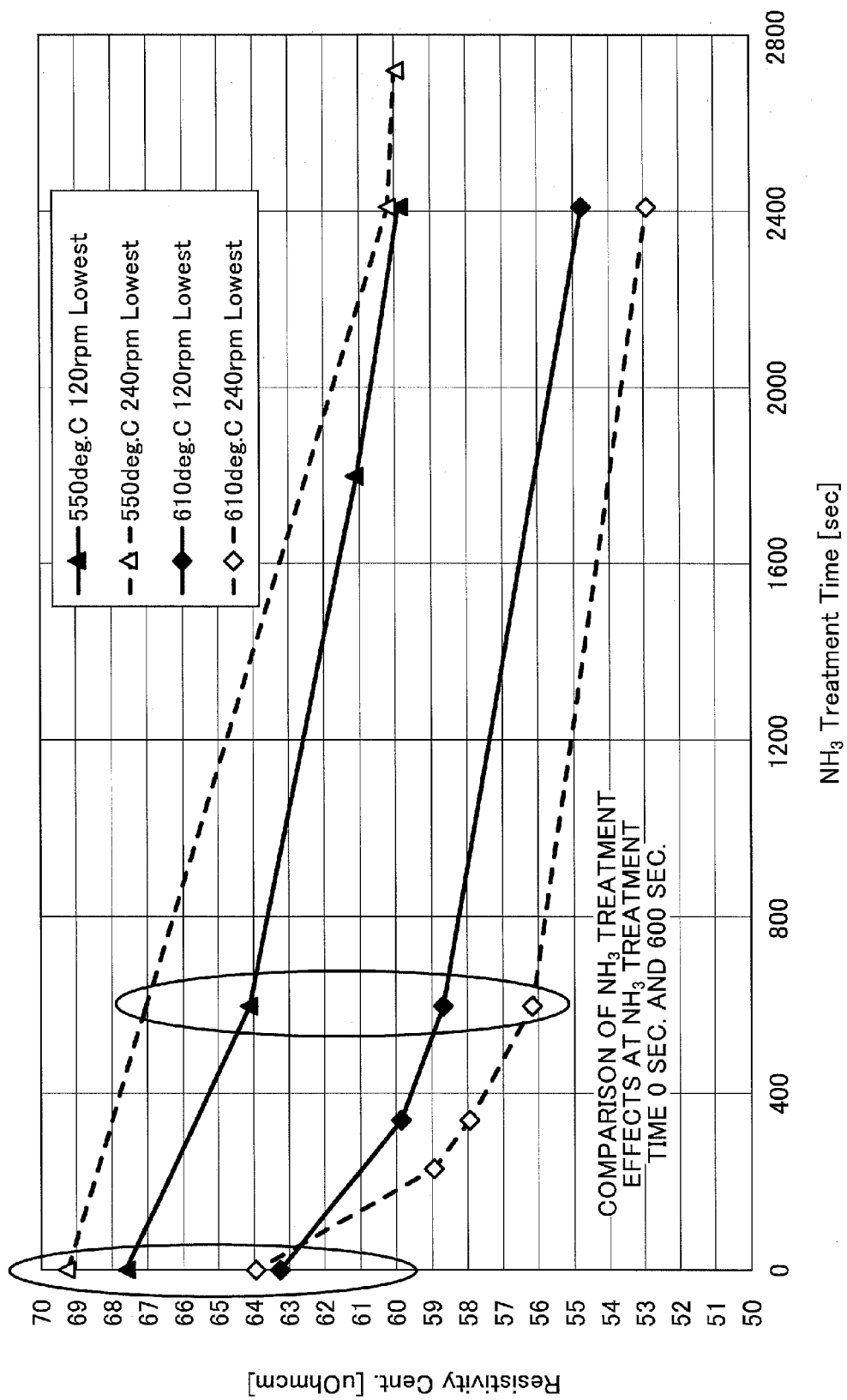
FIG. 9 is a graph for showing a result when practicing the method of depositing the film of an embodiment of the present invention.

FIG. 9 is a graph showing a result of an implemented method of depositing a film of the embodiment. In FIG. 9, a transverse axis shows a processing time (seconds) of an $NH_3$ modification treatment in a film property improvement process, and a longitudinal axis shows a resistance value ($\Omega$/cm) of a TiN film.

With respect to film deposition conditions, a pressure in a chamber was 4 Torr; a flow rate of the $TiCl_4$ gas was 500 sccm; and a flow rate of an $NH_3$ gas was 15 slm. Under the conditions, a 40 nm thick film was deposited for each of two cases of wafer temperatures of 550 degrees C. and 610 degrees C., and for each of two cases of rotational speeds of 120 rpm and 240 rpm. With respect to conditions of the purge gas, a flow rate of an $N_2$ gas supplied in the separation areas was 15 slm, and a flow rate of an $N_2$ gas supplied around the rotational shaft of the turntable was 10 slm.

An $NH_3$ modification treatment was performed under the pressure of 9 Torr in the chamber and at the rotational speed of 10 rpm.

As illustrated in FIG. 9, after the $NH_3$ modification treatment starts, resistance values of the TiN film decrease as the time passes. The processing time period of the $NH_3$ modification treatment was 2400 seconds. The absolute value of the resistance value was the lowest when the wafer temperature was 610 degrees C. and the rotational speed was 240 rpm, which meant a case of a high temperature and a high rotational speed. The absolute value of the resistance value was the second lowest when the wafer temperature was 610 degrees C. and the rotational speed was 120 rpm, was the next lowest when the wafer temperature was 550 degrees C. and the rotational speed was 120 rpm, and was the last lowest when the wafer temperature was 550 degrees C. and the rotational speed was 240 rpm.

Subsequently, a rate of modification effect (improvement rate) during the modification time period of 0 to 600 seconds was calculated regarding the $NH_3$ modification treatment. The rate of modification effect shows an amount of decrease from the resistance value when the $NH_3$ modification treatment time is zero seconds in percent figures.

Figure 10A:
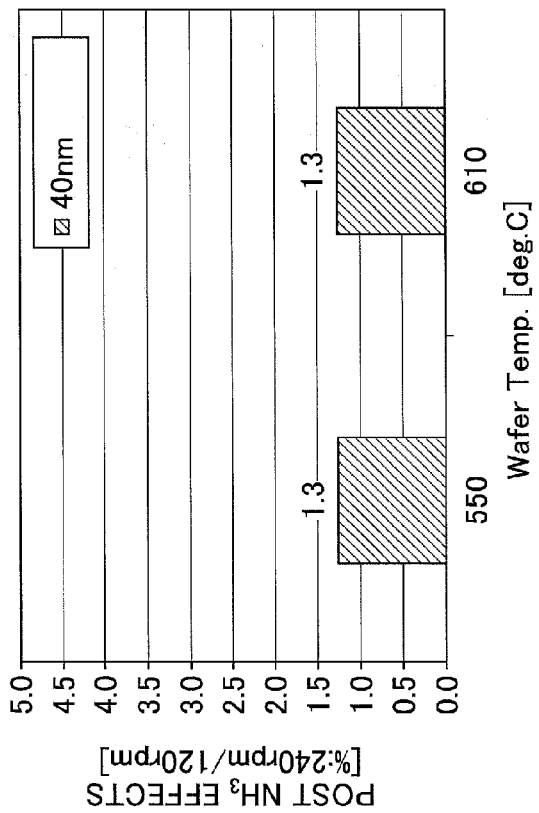
FIGS. 10A and 10B are graphs for showing an effect of an $NH_3$ modification treatment of the method of depositing the film of a working example.
Figure 10B:
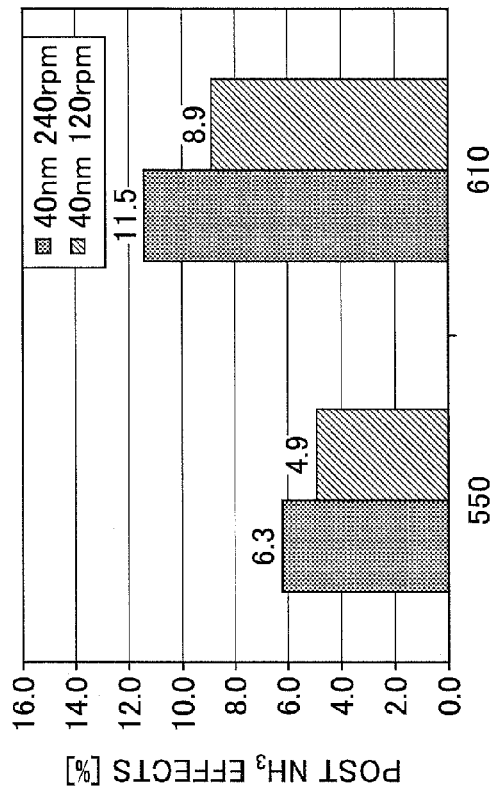

FIGS. 10A and 10B are graphs showing effects of the $NH_3$ modification treatment of the method of depositing the film of the working example.

FIG. 10A is a graph showing effects of the $NH_3$ modification treatment at the substrate temperature of 550 degrees C. and 610 degrees C. in the rotational speed of 120 rpm and 240 rpm. In FIG. 10A, comparing the case of rotational speed of 240 rpm with the case of rotational speed of 120 rpm, the modification treatment effect at the higher rotational speed of 240 rpm is higher than that at 120 rpm in either 550 degrees C. or 610 degrees C. Moreover, comparing the case of 610 degrees C. to the case of 550 degrees C., the modification effect at 610 degrees C. is higher than that at 550 degrees C. Accordingly, the film deposition condition of higher rotational speed and higher temperature produces the best result.

FIG. 10B is a graph showing rates of increase of the effects at the rotational speeds of the turntable at 120 rpm and 240 rpm in the method of depositing the film of the working example. More specifically, in FIG. 10A, the effect of modification of the TiN film was higher at the rotational speed of 240 rpm than at 120 rpm in any case of the substrate temperature at 550 degrees C. or 610 degrees C. In contrast, FIG. 10B shows calculated rates of improvement of how much the effect of modification of the TiN film increased by changing the rotational speed from 120 rpm to 240 rpm. In FIG. 10B, an $NH_3$ effect increasing phenomenon at a 240 rpm (cycle time is 0.25 seconds) film deposition relative to a 120 rpm (cycle time is 0.5 seconds) film deposition is similar in both cases of 550 degrees C. and 610 degrees C., and a result that a temperature dependency of the amount of increase of the modification effect was small was obtained.

Figure 11A:
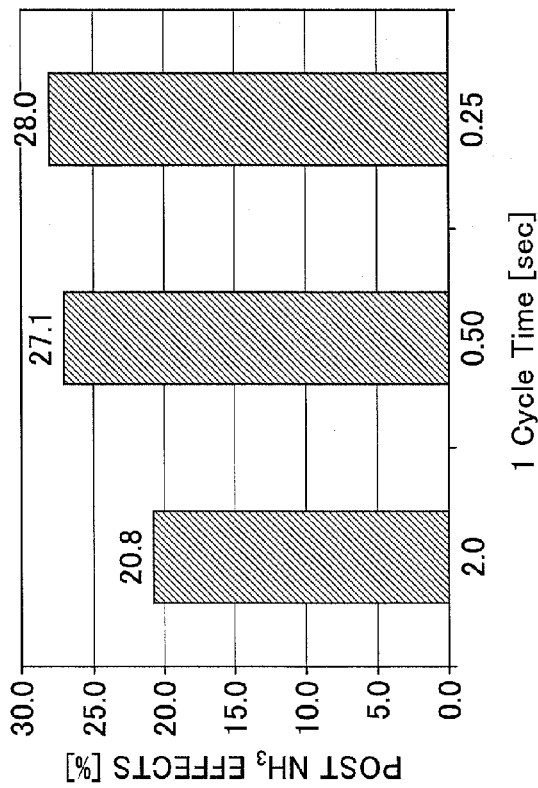
FIGS. 11A and 11B are graphs for showing an example of a relationship between a rotational speed of a turntable and an $NH_3$ modification treatment.
Figure 11B:
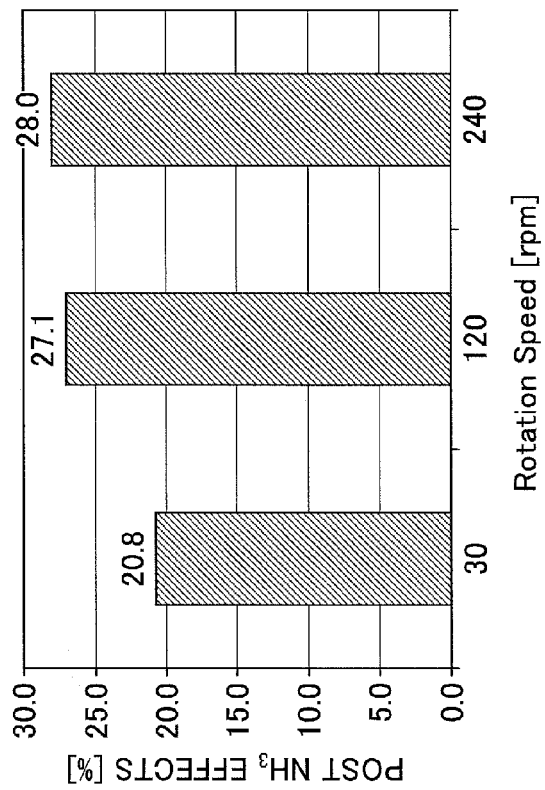

FIGS. 11A and 11B are graphs showing a relationship between the rotational speed of the turntable and the $NH_3$ modification treatment. In FIGS. 11A and 11B, the rotational speed of the turntable is varied under the condition of the substrate temperature of 300 degrees C.

FIG. 11A is a graph showing effects of the $NH_3$ modification treatment of the method of depositing the film of the working example by the rotational speed standard. As shown in FIG. 11A, the TiN films deposited at the rotational speed of 120 rpm and 240 rpm of the working example have high values of the $NH_3$ modification treatment effects of 27.1% and 28.0%. In contrast, a TiN film deposited at the rotational speed of 30 rpm in a comparative example, has a value of the $NH_3$ modification treatment effect of 20.8%, which is lower than the values at the rotational speed of 120 rpm and 240 rpm. In addition, similarly to FIGS. 10A and 10B, the effect of the modification treatment is greater at the higher rotational speed of 240 rpm than that at the lower rotational speed of 120 rpm.

Accordingly, as shown by FIG. 11A, by depositing a film by rotating the turntable 2 at a high speed of 120 to 240 rpm, the effect of the $NH_3$ modification treatment becomes greater than the conventional way in which the turntable 2 rotates at the low speed of 30 rpm.

FIG. 11B is a graph showing effects of the $NH_3$ modification treatment of the working example shown in FIG. 11A, not by the turntable rotational speed standard but by a cycle time standard. As shown in FIG. 11B, the TiN films deposited at the cycle time of 0.50 seconds and 0.25 seconds of the method of depositing the film of the working example have the high values of the $NH_3$ modification treatment effects of 27.1% and 28.0%. In contrast, the TiN film deposited at the cycle time of 2.00 seconds in the comparative example has the lower value of 20.8% than that at the cycle time of 0.50 seconds and 0.25 seconds. Furthermore, the effect of the modification treatment is greater at a shorter cycle time of 0.25 seconds than at a longer cycle time of 0.5 seconds.

Hence, as shown in FIG. 11B, by depositing the film by setting the cycle time at a short time of 0.25 to 0.50 seconds, the effects of the $NH_3$ modification treatment become greater than conventional longer cycle time setting of 2.00 seconds.

Thus, as shown in the working example, according to the method of depositing the film of the embodiments, the modification effect of the $NH_3$ modification treatment can be sufficiently improved, and the low-resistance TiN film can be deposited.

In the method of depositing the film of the embodiments and the working examples, although the description is given by taking an example of applying the method of depositing the film of the embodiments of the present invention to the film deposition of the TiN film, the method of depositing the film of the embodiments of the present invention can be widely applied to a variety of film deposition processes as long as a film having conductivity used for an electrode and the like is deposited. For example, the method of depositing the film of the embodiments of the present invention can be applied to a film deposition using a first process gas containing another metal component and a second process gas containing a nitrogen component.

As described above, according to embodiments of the present invention, a low-resistance thin film can be deposited.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of depositing the film have been described in detail, it should be understood that the various changes, substitutions, and alterations could be made hereto without departing from the spirit and scope of the invention.

What is claimed is:

1. A method of depositing a film, the method comprising the steps of:
   alternately supplying a first process gas and a second process gas that react with each other to cause an atomic layer or a molecular layer of a reaction product of the first process gas and the second process gas to deposit on a substrate in a chamber by repeating a cycle of alternately supplying the first process gas and the second process gas to the substrate once each cycle; and
   continuing to supply the second process gas while stopping the supply of the first process gas for a predetermined period of time after depositing the film of a predetermined thickness by repeating the cycle a predetermined number of times,
   wherein a cycle time of the cycle is set at a predetermined time that causes the reaction product to have a density low enough to ensure gaps and/or intrusion routes to allow the second process gas to go into the film during the step of continuing to supply the second process gas while stopping the supply of the first process gas for the predetermined period of time.

2. The method of claim 1, wherein the cycle time is set in a range from 0.25 to 0.5 seconds.

3. The method of claim 1,
   wherein the substrate is placed on a turntable including a substrate receiving area formed in a surface thereof,
   wherein a first process area to supply the first process gas, a second process area to supply the second process gas and a separation area to separate the first process area and the second process area are provided above and along the turntable, and
   wherein one cycle finishes when the turntable is rotated once.

4. The method of claim 3,
   wherein a rotational speed of the turntable is 120 rpm when the cycle time is 0.5 seconds, and
   the rotational speed of the turntable is 240 rpm when the cycle time is 0.25 seconds.

5. The method of claim 3, wherein an inactive gas is supplied into the separation area.

6. The method of claim 1, wherein the first process gas is a gas containing a metal, and the second process gas is a gas containing nitrogen.

7. The method of claim 6, wherein the gas containing the metal is a titanium-containing gas, and the gas containing nitrogen is a gas containing ammonia.

8. The method of claim 7, wherein the titanium-containing gas is a $TiCl_4$ gas, and the gas containing ammonia is an $NH_3$ gas.

9. The method of claim 1, wherein the substrate is heated up to 300 degrees C. or higher.

10. The method of claim 9, wherein the substrate is heated up to 550 degrees C. or higher.

11. The method of claim 9, wherein the substrate is heated up to 610 degrees C. or lower.

12. The method of claim 1, wherein a second cycle time of the step of continuing to supply the second process gas while stopping the supply of the first process gas is longer than the cycle time of the step of alternately supplying the first process gas and the second process gas to the substrate.

13. The method of claim 1, wherein the predetermined period of time of the step of continuing to supply the second process gas while stopping the supply of the first process gas is longer than a time period when the step of alternately supplying the first process gas and the second process gas to the substrate is performed.

14. The method of claim 1, wherein the substrate is heated up to the same temperature throughout the step of alternately supplying the first process gas and the second process gas to the substrate and the step of continuing to supply the second process gas while stopping the supply of the first process gas.

* * * * *